(12) United States Patent
Helmig et al.

(10) Patent No.: US 7,938,650 B2
(45) Date of Patent: May 10, 2011

(54) MANUFACTURED ROUND PLUG CONNECTOR FOR ETHERNET

(75) Inventors: Christian Helmig, Detmold (DE); Matthias Bergmann, Hameln (DE); Jens Koester, Steinheim (DE)

(73) Assignee: Phoenix Contact GmbH & Co. KG, Blomberg (DE)

( * ) Notice: Subject to any disclaimer, the term of this patent is extended or adjusted under 35 U.S.C. 154(b) by 0 days.

(21) Appl. No.: 12/516,098

(22) PCT Filed: Nov. 23, 2007

(86) PCT No.: PCT/EP2007/010187
§ 371 (c)(1),
(2), (4) Date: May 22, 2009

(87) PCT Pub. No.: WO2008/061780
PCT Pub. Date: May 29, 2008

(65) Prior Publication Data
US 2010/0048061 A1    Feb. 25, 2010

(30) Foreign Application Priority Data
Nov. 24, 2006  (DE) .......................... 10 2006 056 001

(51) Int. Cl.
*H01R 12/00*    (2006.01)
(52) U.S. Cl. ....................................... 439/76.1; 439/941
(58) Field of Classification Search ................. 439/76.1, 439/941, 676
See application file for complete search history.

(56) References Cited

U.S. PATENT DOCUMENTS

| | | | |
|---|---|---|---|
| 5,310,363 A | 5/1994 | Brownell et al. | |
| 5,326,284 A | 7/1994 | Bohbot et al. | |
| 5,997,358 A | 12/1999 | Adriaenssens et al. | |
| 6,099,357 A | 8/2000 | Reichle | |

(Continued)

FOREIGN PATENT DOCUMENTS

CN    1835300 A    9/2006

(Continued)

OTHER PUBLICATIONS

International Search Report for PCT/EP2007/010187 mailed May 19, 2008.

*Primary Examiner* — Hien Vu
(74) *Attorney, Agent, or Firm* — Leydig, Voit & Mayer, Ltd.

(57) ABSTRACT

A connector includes an inner structure divided into first, second, and third components. The first component includes plug contacts disposed so as to form a circular plug face configured for connection to a mating connector. The second component includes a connection block having connection contacts configured for connection of a data line connection. The third component includes a printed circuit board configured to provide an adaptable connecting element between the connection block and the plug contacts. The printed circuit board includes a plurality of layers in a sandwich configuration, the plurality of layers including layers having conductive trace alternating with layers having a dielectric. A first layer having a dielectric is disposed between two layers having conductive trace so as to form a first parallel plate capacitor. A second layer having a dielectric is disposed between two layers having trace so as to form a second parallel plate capacitor. A third layer having a dielectric is disposed between the first and second parallel plate capacitors. At least one of the first and second layers is thinner than the third layer.

14 Claims, 9 Drawing Sheets

U.S. PATENT DOCUMENTS

| | | |
|---|---|---|
| 6,165,023 A | 12/2000 | Troutman et al. |
| 6,176,742 B1 | 1/2001 | Arnett et al. |
| 6,270,381 B1 | 8/2001 | Adriaenssens et al. |
| 6,319,069 B1 | 11/2001 | Gwiazdowski |
| 6,379,157 B1 | 4/2002 | Curry et al. |
| 6,402,560 B1 | 6/2002 | Lin |
| 6,840,779 B2 | 1/2005 | Eberle et al. |
| 6,866,548 B2 | 3/2005 | Hashim |
| 7,038,554 B2 | 5/2006 | Seefried |
| 7,074,092 B1 | 7/2006 | Green et al. |
| 7,179,131 B2 | 2/2007 | Caveney et al. |
| 7,249,979 B2 | 7/2007 | Gerber et al. |
| 7,401,402 B2 | 7/2008 | Bresche et al. |
| 7,452,246 B2 | 11/2008 | Caveney et al. |
| 7,540,789 B2 | 6/2009 | Gerber et al. |
| 2002/0009906 A1* | 1/2002 | Akama et al. ............... 439/76.1 |
| 2002/0142630 A1* | 10/2002 | Molus et al. ............... 439/76.1 |
| 2003/0129880 A1 | 7/2003 | Arnett et al. |
| 2004/0082227 A1 | 4/2004 | Hashim |
| 2004/0097105 A1* | 5/2004 | Kaylie et al. ............... 439/76.1 |
| 2004/0137768 A1* | 7/2004 | Haehn et al. ............... 439/76.1 |
| 2004/0147165 A1 | 7/2004 | Celella et al. |
| 2005/0181676 A1 | 8/2005 | Caveney et al. |
| 2005/0253662 A1 | 11/2005 | Seefried |
| 2005/0277339 A1 | 12/2005 | Caveney et al. |
| 2006/0134992 A1 | 6/2006 | Green et al. |
| 2006/0160428 A1 | 7/2006 | Hashim |
| 2006/0183359 A1 | 8/2006 | Gerber et al. |
| 2006/0264106 A1 | 11/2006 | Bresche et al. |
| 2007/0117469 A1 | 5/2007 | Caveney et al. |
| 2008/0057793 A1 | 3/2008 | Gerber et al. |
| 2008/0166919 A1 | 7/2008 | Bresche et al. |
| 2009/0075523 A1 | 3/2009 | Caveney et al. |

FOREIGN PATENT DOCUMENTS

| | | |
|---|---|---|
| DE | 20008311 U1 | 7/2000 |
| DE | 10255190 A1 | 6/2004 |
| DE | 10310434 A1 | 9/2004 |
| EP | 0622872 A2 | 11/1994 |
| EP | 1063734 A2 | 12/2000 |
| EP | 1096620 A1 | 5/2001 |
| EP | 1170834 A2 | 1/2002 |
| EP | 1414115 A1 | 4/2004 |
| EP | 1693933 A1 | 8/2006 |
| JP | 2006228735 A | 8/2008 |
| WO | 0180376 A1 | 10/2001 |
| WO | 0186760 A1 | 11/2001 |
| WO | 0217442 A2 | 2/2002 |
| WO | 1281216 A1 | 2/2003 |
| WO | 2005081369 A1 | 9/2005 |
| WO | 2005117200 A1 | 12/2005 |
| WO | 2006017332 A1 | 2/2006 |
| WO | 2006062794 A1 | 6/2006 |
| WO | 2006068974 A2 | 6/2006 |

* cited by examiner

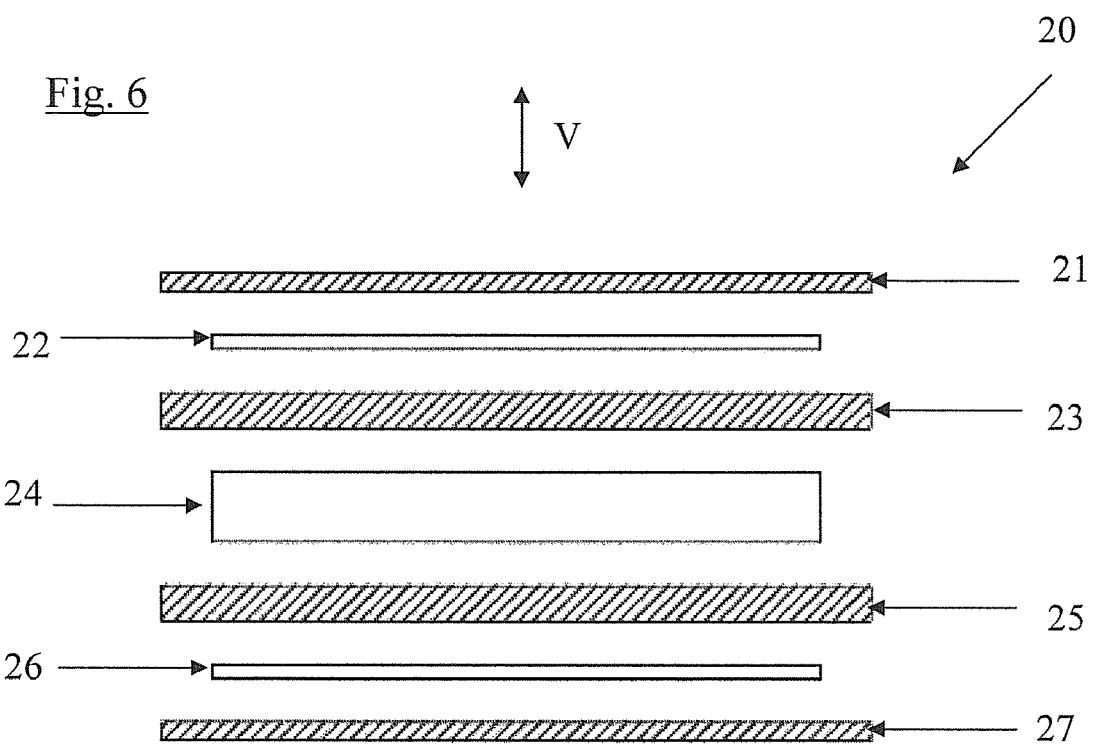

MANUFACTURED ROUND PLUG CONNECTOR FOR ETHERNET

CROSS REFERENCE TO PRIOR APPLICATIONS

This application is a U.S. National Phase application under 35 U.S.C. §371 of International Application No. PCT/EP2007/010187, filed Nov. 23, 2007, and claims benefit to German Patent Application No. DE 10 2006 056 001.9, filed Nov. 24, 2006. The International Application was published in German on May 29, 2008 as WO 2008/061780 under PCT Article 21(2).

FIELD

The present invention relates to an industrial, Ethernet-capable connector having a circular connection face.

BACKGROUND

To ensure unrestricted data transmission in plug connectors for Ethernet applications, such connectors must meet certain requirements, for example in terms of near end crosstalk (NEXT), far end crosstalk (FEXT), return loss, loss, which are also specified, for example, in DIN-EN 50173. Design parameters for the optimization of the high-frequency performance (HF performance) of differential data pairs include, for example, the dielectric constant of the insulating material used, the geometric distance of the pairs from each other, or the thickness of the wires or contacts. In a module or device made up of individual components, a certain HF performance is determined by the individual performance of each component.

In telecommunication and/or office application technologies, it is common practice to use modular plug connections, such as the RJ-45 connector, in which the contacts to be connected to mating contacts are in a parallel or in-line arrangement. In these fields, it is common in the art that an element, such as a printed circuit board, which connects the individual components, is provided with inductive and/or capacitive coupling features to compensate for the previously negative performance, so that the module meets requirements such as Cat5 (in accordance with DIN EN 50173).

There is ample prior patent or patent application documents in the field of telecommunication and/or office application technologies, including, for example, EP 1 063 734, EP 1 096 620, EP 1 170 834, EP 1 414 115, U.S. Pat. No. 5,310,363, U.S. Pat. No. 5,326,284, U.S. Pat. No. 5,997,358, U.S. Pat. No. 6,099,357, U.S. Pat. No. 6,319,069, U.S. Pat. No. 6,402,560, U.S. Pat. No. 6,840,779, US 2004/0147165, US 2005/0277339, US 2006/0160428, WO 01/80376, WO 02/17442, WO 2005/081369, WO 2005/117200, WO 2006/017332, WO 2006/062794 and WO 2006/068974.

Thus, the application and technology of structured cabling of office buildings are introduced and developed to a point where now new standardization efforts are being undertaken to transfer the achievements from the office world to the industrial environment. However, unlike the tree and star topologies commonly used in the office and telecommunications world, line and ring topologies are preferable in an industrial environment. Moreover, in addition to voice and conventional data transmission, open- and closed-loop process control systems are required to function reliably under all operating conditions, which, in addition to increased environmental requirements in various industrial fields, also increases the reliability requirements.

As a consequence, the different requirements of the telecommunication and/or office application technologies on the one hand, and the industrial environment on the other hand, inevitably lead to different plug connection variants, and the design approaches developed for modular plugs used in the telecommunication and/or office application technologies are not easily applicable to industrial plug connectors.

In the field of industrial plug connectors, two tendencies have emerged. First of all, commercially available RJ45 connectors, such as are known from the field of office communication, are prepared by external packaging for use in an industrial environment. In particular, different housing variants for rough environmental conditions are available, into which RJ45 connector inserts for 100, 250 or 600 MHz may be inserted, providing a shielded or unshielded configuration. The housing variants differ in shape (round or rectangular connector housing), locking devices (screw-type locks, bayonet locks, latching levers, push-pull locks), and specific properties, and are often not plug-compatible.

Secondly, connectors which are widely used in the industrial environment, such as the M12 round plug connector, which has been introduced at the field bus level in many applications for rough environmental conditions, are modified in terms of their inner structure in such a way that they can meet the data transmission requirements. In the field of M12 connectors, there are now available Cat5-compliant 4-pole plug connectors, both as patch cables and in a version that can be assembled in the field.

When the signal multiplexing technology is used to achieve higher transmission rates, more data pairs, at least 4 data pairs, are needed which, so far, are commercially available only as preassembled, Cat5-compliant M12 patch cables in an 8-pole version.

Document WO 01/86760 A1 describes an electrical plug connector in the form of a T-coupler, in which plug contacts and screw-on modules are connected to a printed circuit board by solder contacts.

Document WO 02/0717442 describes a communication connector with inductive compensation, in which are provided a printed circuit board having wire trace layers and inter-digitated capacitance.

Document DE 102 55 190 A1 describes a round plug connector unit for free assembly and connection of flexible cables.

SUMMARY

It is an aspect of the present invention to provide an industrial round plug connector which can be assembled in the field and is suitable for use in rough industrial environments, and which can be used for transmitting multiplex signals, and thus also for Ethernet applications.

In an embodiment, the present invention provides a connector including an inner structure divided into first, second, and third components. The first component includes plug contacts disposed so as to form a circular plug face configured for connection to a mating connector. The second component includes a connection block having connection contacts configured for connection of a data line connection. The third component includes a printed circuit board configured to provide an adaptable connecting element between the connection block and the plug contacts. The printed circuit board is configured to provide a signal transmission path between the plug contacts and the connection contacts of the connection block. The printed circuit board includes a plurality of layers in a sandwich configuration, the plurality of layers including layers having conductive trace alternating with layers having a dielectric. A first layer of the layers having a dielectric is disposed between a first and second layer of the layers having conductive trace so as to form a first parallel plate capacitor. A second layer of the layers having a dielectric is disposed between a third and fourth layer of the layers having trace so as to form a second parallel plate capacitor. A third layer of the layers having a dielectric is disposed between the first and second parallel plate capacitors. At least one of the first and second layers having a dielectric is thinner than the third layer having a dielectric.

BRIEF DESCRIPTION OF THE DRAWINGS

Other advantages and features of the present invention are described in the following description of an exemplary embodiment, with reference to the accompanying drawings, in which:

FIG. 6 is a schematic view showing the layer structure of the printed circuit board according to FIG. 2;

DETAILED DESCRIPTION

Figure 1:
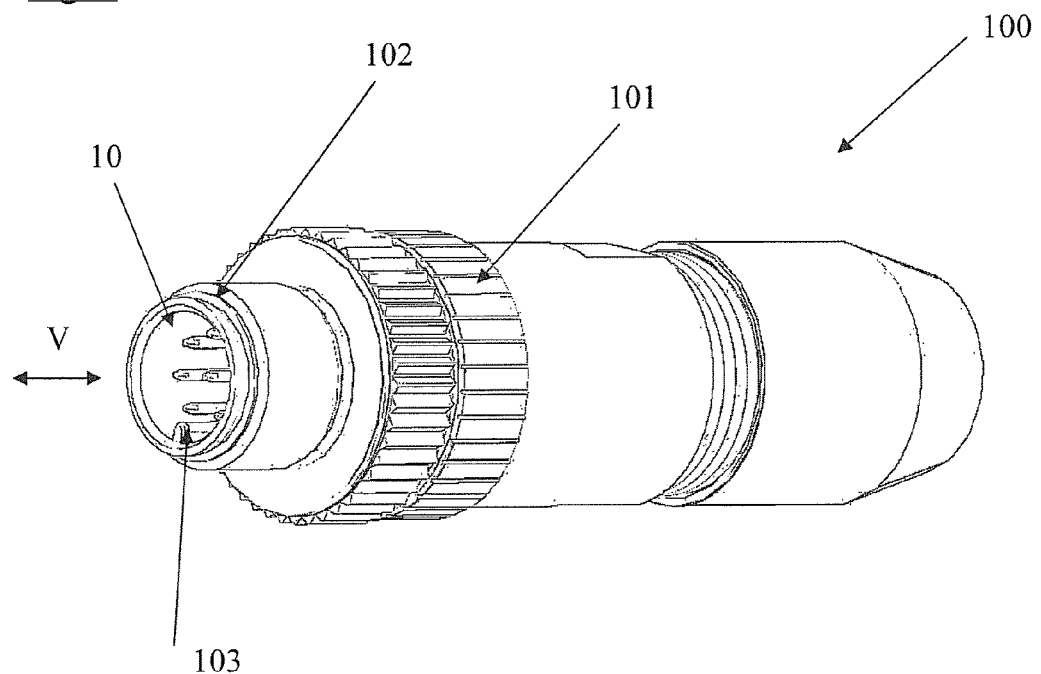
FIG. 1 is a view showing an 8-pole M12 round plug connector.

In an embodiment, the present invention provides a plug connector whose inner structure can be divided into three individual main components, and in which one part is comprised of plug contacts which are arranged to form a circular plug face of the plug connector for connection to a mating connector, another part is a connection block that enables a data line to be connected in the field and thus allows for free assembly, and the third part is a printed circuit board which forms an adaptable connecting element between the connection block and the plug contacts and provides the connection of the signal transmission paths between the plug contacts and the connection contacts of the connection block, so that, in this manner, free assembly, transmission of multiplex signals, and use for Ethernet applications are possible for the first time in an industrial plug connector having a circular plug face.

In an embodiment, the present invention provides an industrial, round connector including a connecting element of circular cross-section for mechanical connection to a complementary mating connector in the direction of a connection axis extending perpendicular to the cross-section, and further including a printed circuit board extending parallel to the cross-section and having a first and an opposite second surface facing along the connection axis, and further including a plurality of elongated plug contacts extending substantially along or parallel to the connection axis and each having first and second ends, the first ends of said plug contacts extending from the first outer surface into the printed circuit board and being held therein, and the opposite second ends defining a circular connection face, and yet further including a connection block disposed on the second outer surface and having a number of connection contacts corresponding to the number of plug contacts, said connection contacts extending from the second outer surface into the printed circuit board and being held therein, the connection block further having, for each of said connection contacts, a receiving means electrically connected thereto and adapted to receive a wire of a data cable, and the printed circuit board accommodating conductive traces in at least two planes, of which some, in each case, electrically connect a plug contact and a connection contact to create a respective signal transmission path, while others create a capacitance between selected signal transmission paths.

The connector is preferably an 8-pole M12 round plug connector. If this connector is configured as a round plug, it is expedient for the second ends of the plug contacts to be in the form of pin contacts.

The printed circuit board conveniently has several layers in a substantially sandwich configuration, in which layers having conductive traces alternate with dielectric layers.

It is advantageous that a capacitance between one of the selected signal transmission paths in each case be created by two conductive traces located in different layers which are spaced apart by a dielectric layer. In a practical embodiment, two conductive traces for creating a capacitance in each case form a flat parallel plate capacitor.

An embodiment includes parallel plate capacitors which are formed in at least two different planes.

Conveniently, a dielectric layer between two layers which form a parallel plate capacitor is thinner than a dielectric layer between two parallel plate capacitors provided in different planes.

Moreover, in order to ensure the greatest possible compatibility, it is advantageous for the signal transmission paths to be based on the RJ-45 standard.

In embodiments, the connection contacts of the connection block are arranged in a rectangular pattern, which allows for use of connection blocks that are already established on the market.

For ease of integration, the connection contacts are held in the printed circuit board parallel to and around the connection axis.

The diameter of the circular plug face is defined by plug contacts which are arranged at a radius around the connection axis. In an embodiment, the first ends of said plug contacts are arranged at a first common radius around the connection axis, and a transition region is formed between said first ends and the respective opposite second ends of said plug contacts in such a way that said second ends are arranged at a second common radius around the connection axis, and that an additional, inner plug contact is disposed within the radius.

In the following, an embodiment of the present invention will be described using the example of an 8-pole M12 round plug connector.

FIG. 1 shows the basic design of an 8-pole M12 round plug connector, here an 8-pole round plug connector 100 having an outer housing 101 including a shield and having a circular cross-section, and further having a connecting element 102 of circular cross-section for mechanical connection to a complementary mating connector along a connection axis "V" extending perpendicular to the cross-section. In the present example, connecting element 102 has a screw-type lock, so that the round plug according to FIG. 1 is compliant with DIN EN 61076, which describes round plug connectors for control circuits for industrial systems, such as switchgear systems and switchgear devices, and provides blank detail specifications for M8 round plug connectors having screw-type or latching locks and M12 round plug connectors having screw-type locks for low-voltage applications, and which accordingly defines also the circular plug or connection face formed by elongated plug contacts 10, which extend substantially along or parallel to the connection axis within the housing. Precise specifications are also given for the contact diameter and the standardized dimensions. Moreover, round plug 100 has a code 103.

Figure 2:
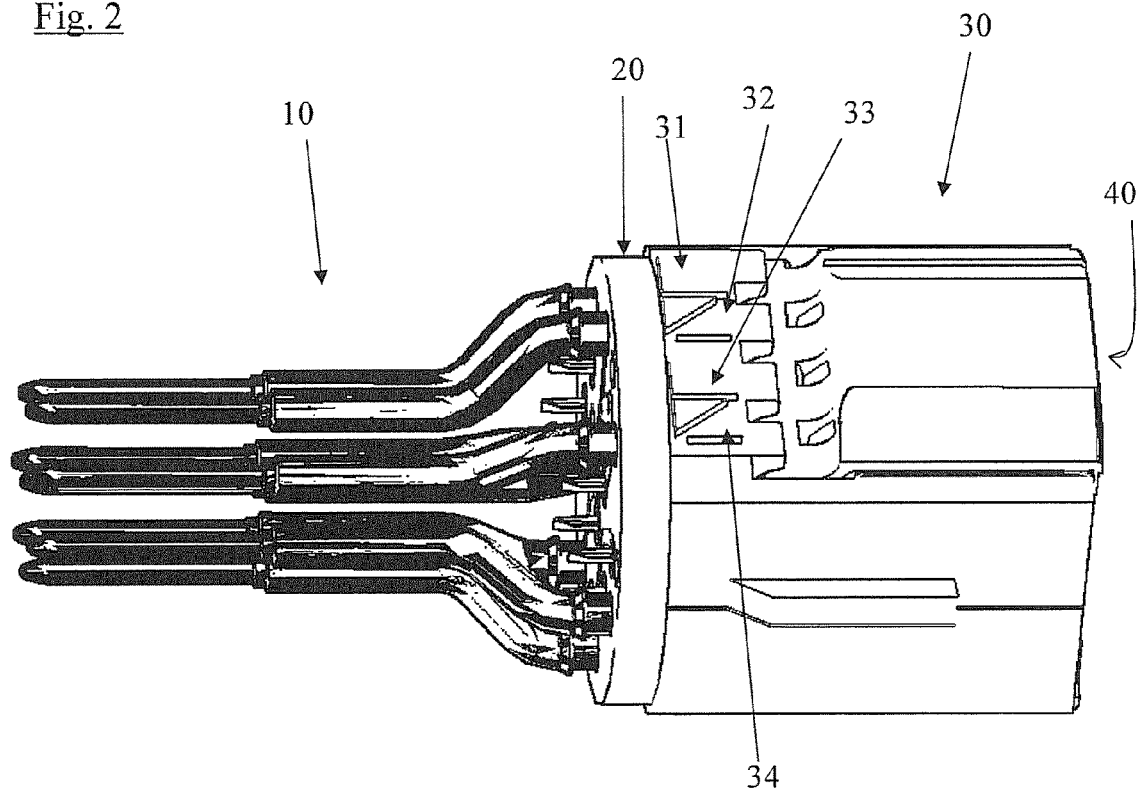
FIG. 2 is a detail view of the inner structure of an 8-pole M12 round plug connector according to an embodiment of the present invention, illustrating the arrangement of the plug contacts, a connection block, and a printed circuit board disposed therebetween.

FIG. 2 shows a detail view of such a round plug 100 according to FIG. 1, illustrating the inner structure which is adapted in accordance with an embodiment of the present invention in terms of the arrangement of connector contacts 10 across a printed circuit board 20 and includes a connection block 30 that allows for free assembly.

Elongated plug contacts 10 of round plug 100 are configured as pins having opposite first and second contact ends. If the round plug connector is a round socket, the plug contacts are accordingly configured in the manner of a socket.

One contact end of each plug contact extends into printed circuit board 20, while the opposite contact ends together define the circular plug face. Printed circuit board 20 extends perpendicular to connection axis "V". To facilitate fitting into housing 101, the printed circuit board is circular in shape and has two opposite outer planar surfaces which face along connection axis "V". The contact ends held in printed circuit board 20 each form a substantially right angle with the printed circuit board surface from which they extend into and are held in the printed circuit board.

Connection block 30 is provided on the opposite outer surface of the printed circuit board. Connection block 30 has a number of connection contacts corresponding to the number of plug contacts 10, said connection contacts extending into printed circuit board 20 from said opposite surface thereof and being held therein. The connection contacts held in the printed circuit board are disposed parallel to and around connection axis "V".

Furthermore, the connection block has, for each of connection contact, a receiving means 40, which is electrically connected thereto and adapted to receive a wire of a data cable. This allows the industrial round plug connector to be freely assembled in the field. It is preferred to use a connection block in which the wire receiving means use a generally known insulation-piercing technique, because this cable termination technique eliminates the need for an often expensive termination tool and, thus, saves time.

Thus, the inner structure of the inventive 8-pole round plug according to FIG. 2 can be divided into three individual main components. One part is comprised of the eight contacts 10 which are arranged to form the plug face of the round plug for connection to a mating connector, another part is the connection block 30 that enables a data line to be connected in the field and thus allows for free assembly, and the third part is the printed circuit board 20 which forms a connecting element between connection block 30 and pin contacts 10 and provides the connection of the signal transmission paths between pin contacts 10 and the connection contacts of connection block 30.

Because of the use of two-wire lines or signal transmission path pairs that are also commonly used in Ethernet applications, there is a potential for crosstalk and capacitive unbalance to occur in connection block 30 and during transfer to contact 10. In this context, the requirements that a plug connector preferably meets, in particular in terms of NEXT and RETURN LOSS, are higher than those to be satisfied by a patch cable, and the transmission link of a plug connector preferably has improved NEXT and RETURN LOSS performance.

In a freely assemblable industrial round plug connector according to an embodiment of the present invention which can also be used for Ethernet applications, for example according to CAT5 (category 5), printed circuit board 20, which forms the connecting element between connection block 30 and plug contacts 10, accommodates conductive traces in at least two planes, of which some, in each case, electrically connect a plug contact and a connection contact to create a respective signal transmission path therebetween, while others provide a capacitance between selected signal transmission paths. This makes it possible, first of all, to ensure that where it is necessary for signal transmission paths to intersect, the conductive traces have sufficient insulating clearance therebetween and that they will not cause short circuits. Secondly, capacitive unbalances can be compensated for by integrating additional capacitances into the printed circuit board so as to create as homogenous a capacitive balance as possible.

Moreover, printed circuit board 20 is a component which can be adapted in terms of its layout and electrical function within the scope of an embodiment of present invention, depending on the specific connection block 30 used. Therefore, an embodiment of the present invention also allows integration of connection blocks that are already available on the market, without having to modify them. Such a commercially available connection block 30 has, for example, two parallel rows of four terminal contacts each. In FIG. 2, a row of connection contacts 31, 32, 33 and 34 (located within the connection block 30 and shown in detail in FIG. 3) has respectively associated receiving means.

For the following description, it is assumed that connection block 30 used according to FIG. 2 is a connection block which is designed such that its connection contacts match the plug face of an RJ45 plug connector as is known from telecommunication and office applications. This also makes it possible to assemble a cable which has an RJ45 plug connector attached to one end thereof, while the opposite end is fitted with an M12 round plug connector according to an embodiment of the present invention. Such a use is advantageous, for example, when a programmable controller (PLC) is to be programmed using a notebook, because the interface on the PLC can be equipped with an industrial M12 round plug connector while the standard RJ45 plug connection on the notebook continues to be used. In this application, the notebook can be used for an industrial application on the spot as well as at a workstation in an office without requiring two different interfaces. This provides extensive compatibility with the existing market even through the pin assignment has not yet been standardized for 8-pole M12 plug connectors used in Ethernet applications.

Figure 3:
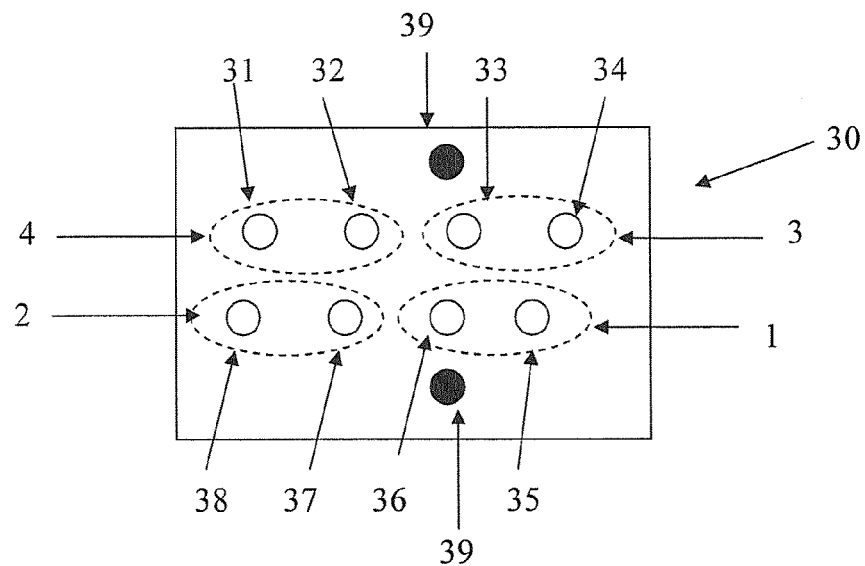
FIG. 3 is a diagrammatic top view of a connection block used according to FIG. 2, shown from the side of the printed circuit board.

FIG. 3 is a diagrammatic top view showing such a connection block from the side of the printed circuit board. Here, the assignment between connection contacts 31, 32, 33, 34, 35, 36, 37 and 38, and the attached signal transmission wires is based on the Ethernet standard. Connection contacts 35 and 36 are assigned to first signal pair "1", it being assumed that when twisted pair lines are used, connection contact 36 is assigned to the striped wire. Connection contacts 37 and 38 are assigned to second signal pair "2", with connection contact 37 being assigned to the striped wire. Connection contacts 33 and 34 are assigned to third signal pair "3", with connection contact 34 being assigned to the striped wire. Connection contacts 31 and 32 are assigned to fourth signal pair "4", with connection contact 32 being assigned to the striped wire.

Figure 4:
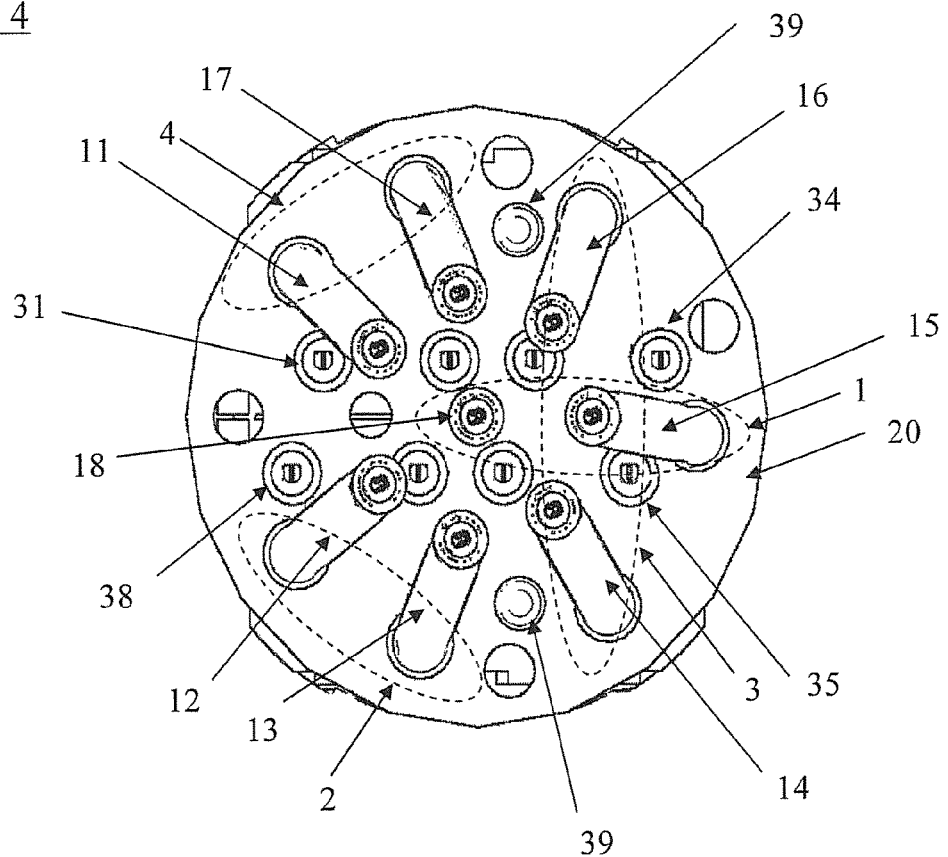
FIG. 4 is a top view showing the plug contacts arranged on the printed circuit board in accordance with FIG. 2.

FIG. 4 shows, in a diagrammatic top view, the plug contacts 10 arranged on the printed circuit board. The eight plug contacts are denoted by 11, 12, 13, 14, 15, 16, 17 and 18. In order for the freely assemblable 8-pole round plug connector of an embodiment of the present invention to match the market and the layout of preassembled 8-pole plug connectors, plug contacts 17 and 11, 13 and 12, 18 and 15, and 16 and 14 form the plug contact pairs for signal pairs 4, 2, 1 and 3, respectively. For the following description, the correspondingly assigned signal transmission path pairs are denoted by 7-1 (signal pair 4), 3-2 (signal pair 2), 8-5 (signal pair 1) and 6-4 (signal pair 3).

Further, in FIG. 3 and FIG. 4, reference numeral 39 denotes mechanical aids for positioning connection block 30 on printed circuit board 20. Said positioning aids are, for example, in the form of two small guide pins of connection block 30, which are insertable into printed circuit board 20. FIG. 4 also shows that by arranging plug contacts 11, 12, 13, 14, 15, 16, 17, 18 and connection contacts 31, 32, 33, 34, 35, 36, 37, 38 in opposed relationship in directions substantially along an axis, an embodiment of the present invention integrates an adapted pin contact geometry, so that the face of the round plug, including the diameter in the contact zone for contacting a mating round plug connector, continues to comply with the specifications of the relevant standards, because otherwise problems could occur in the layout of the printed circuit board.

Figure 5A:
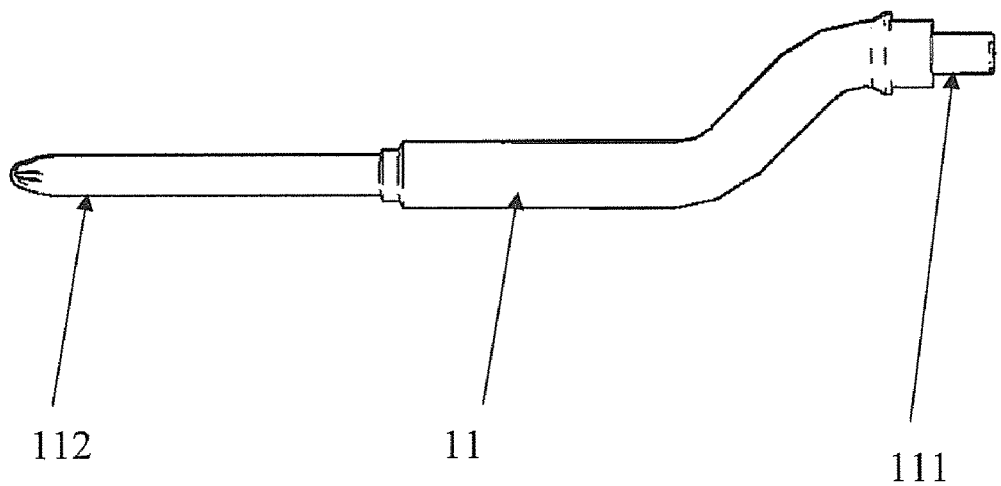
FIG. 5a is a view depicting a curved connector contact of the freely assemblable M12 round plug connector according to FIG. 2.
Figure 5B:
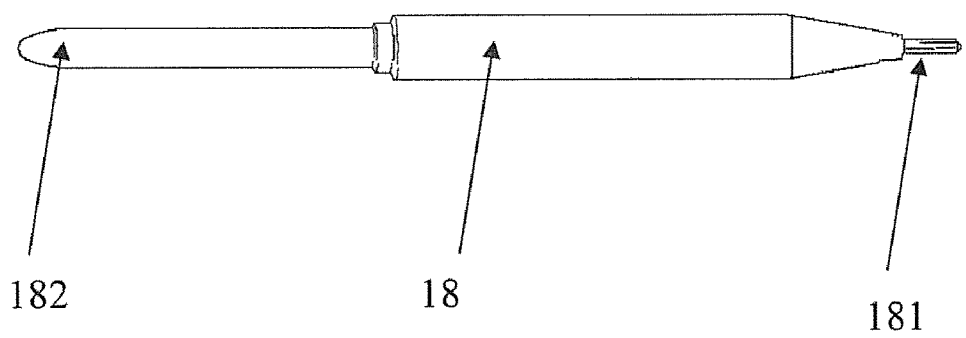
FIG. 5b is a view depicting the central connector contact of the freely assemblable M12 round plug connector according to FIG. 2.
Figure 7:
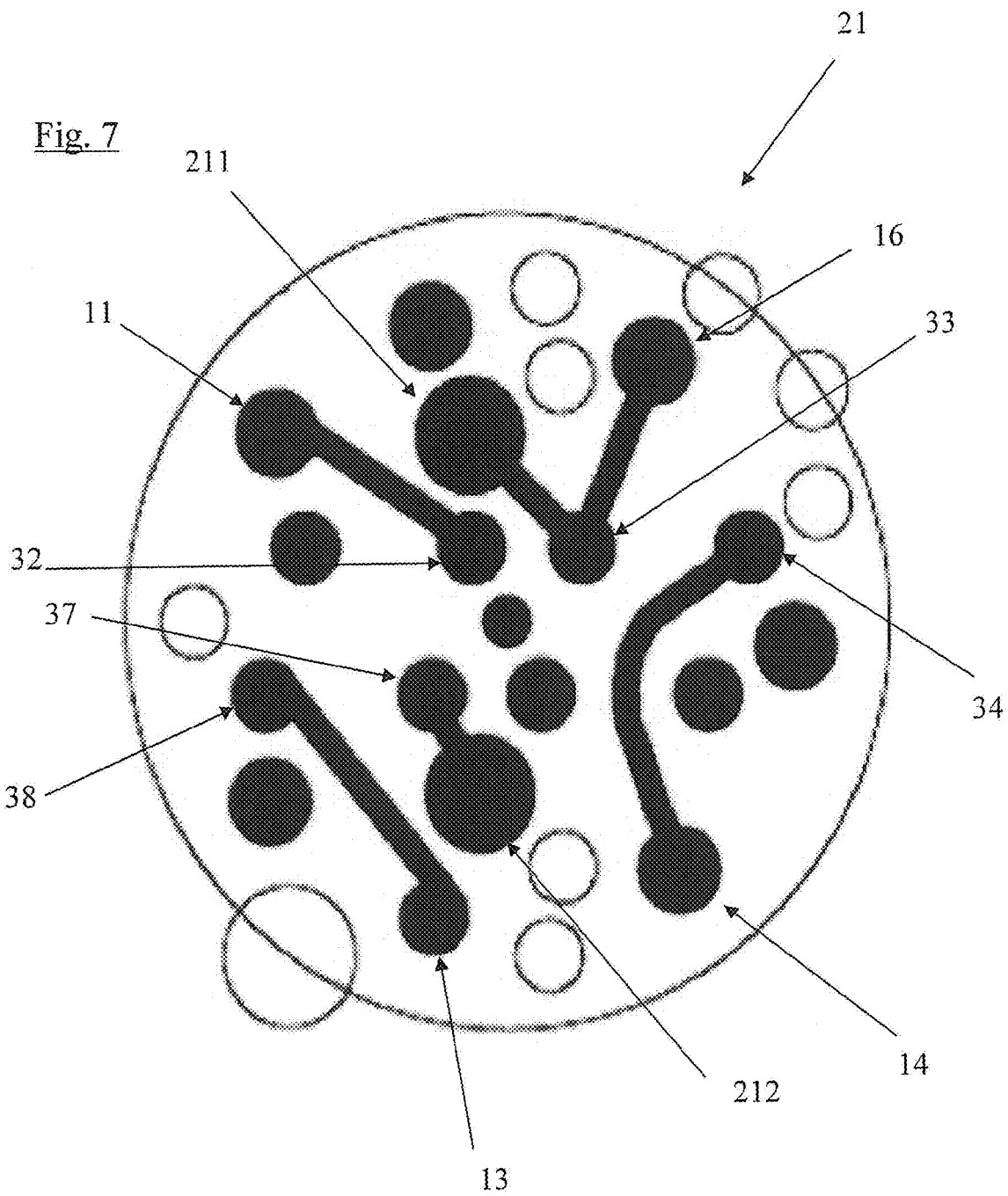
FIG. 7 is a schematic top view of the first layer of the printed circuit board according to FIG. 6.
Figure 8:
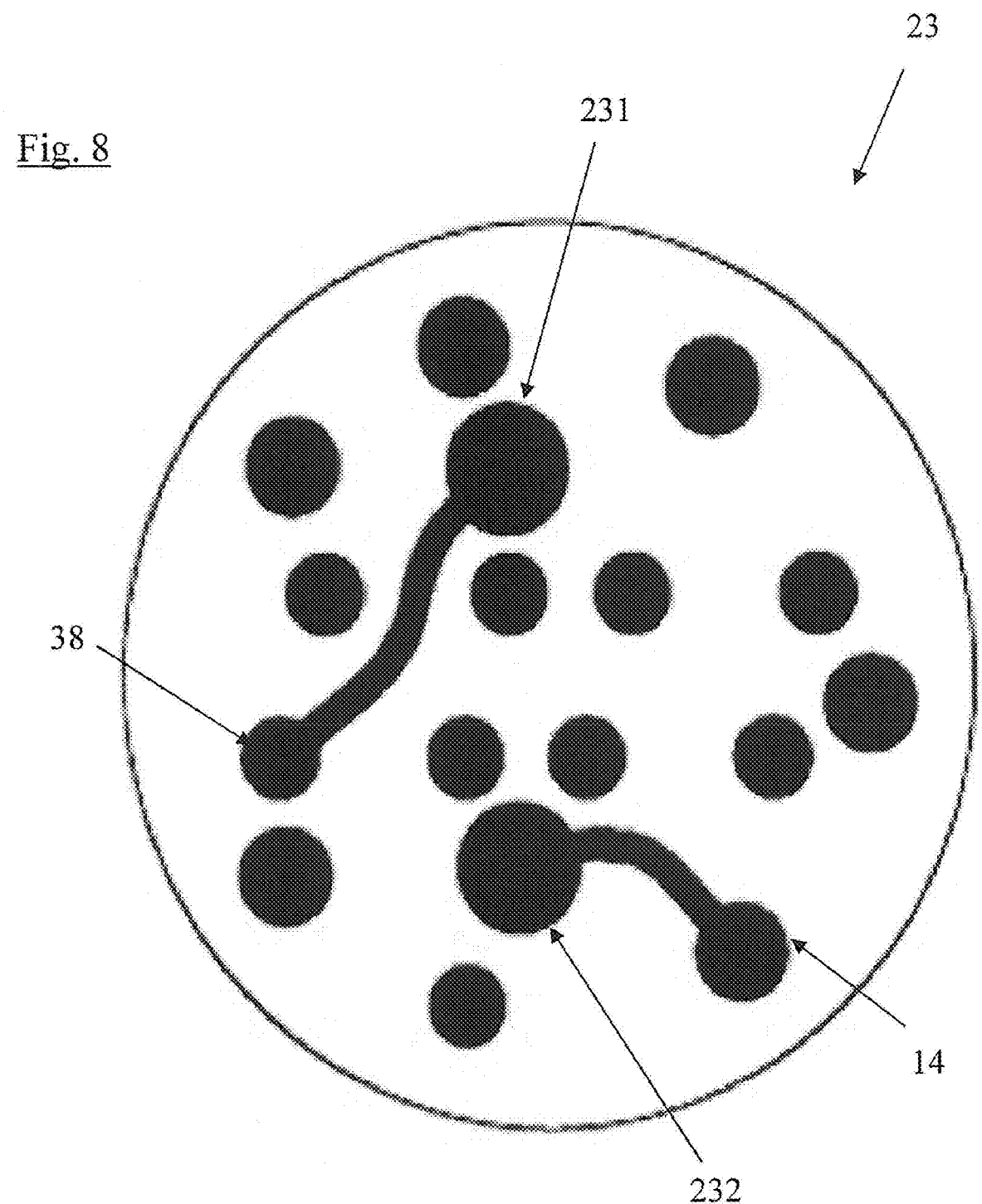
FIG. 8 is a schematic top view of the third layer of the printed circuit board according to FIG. 6.
Figure 9:
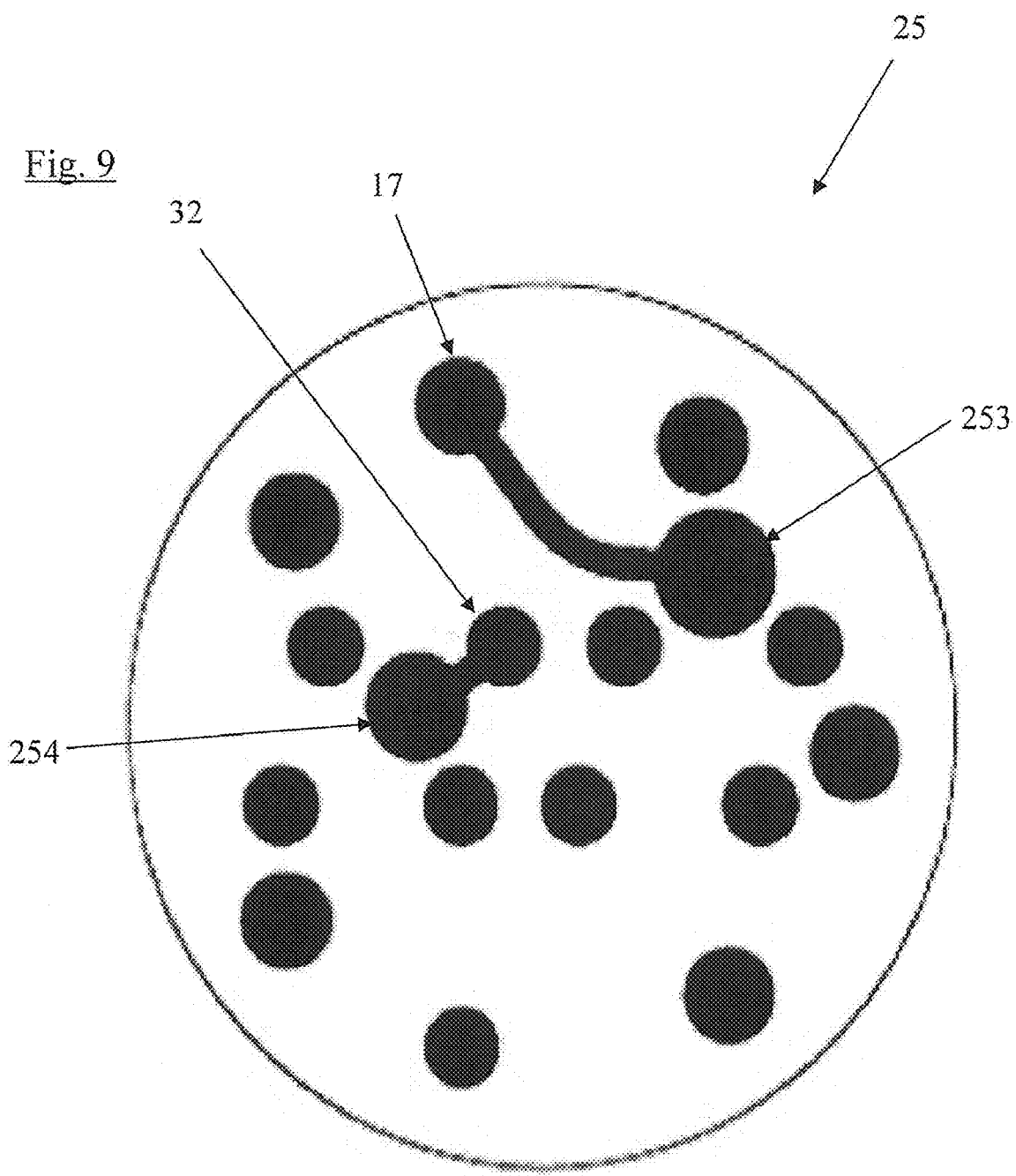
FIG. 9 is a schematic top view of the fifth layer of the printed circuit board according to FIG. 6.
Figure 10:
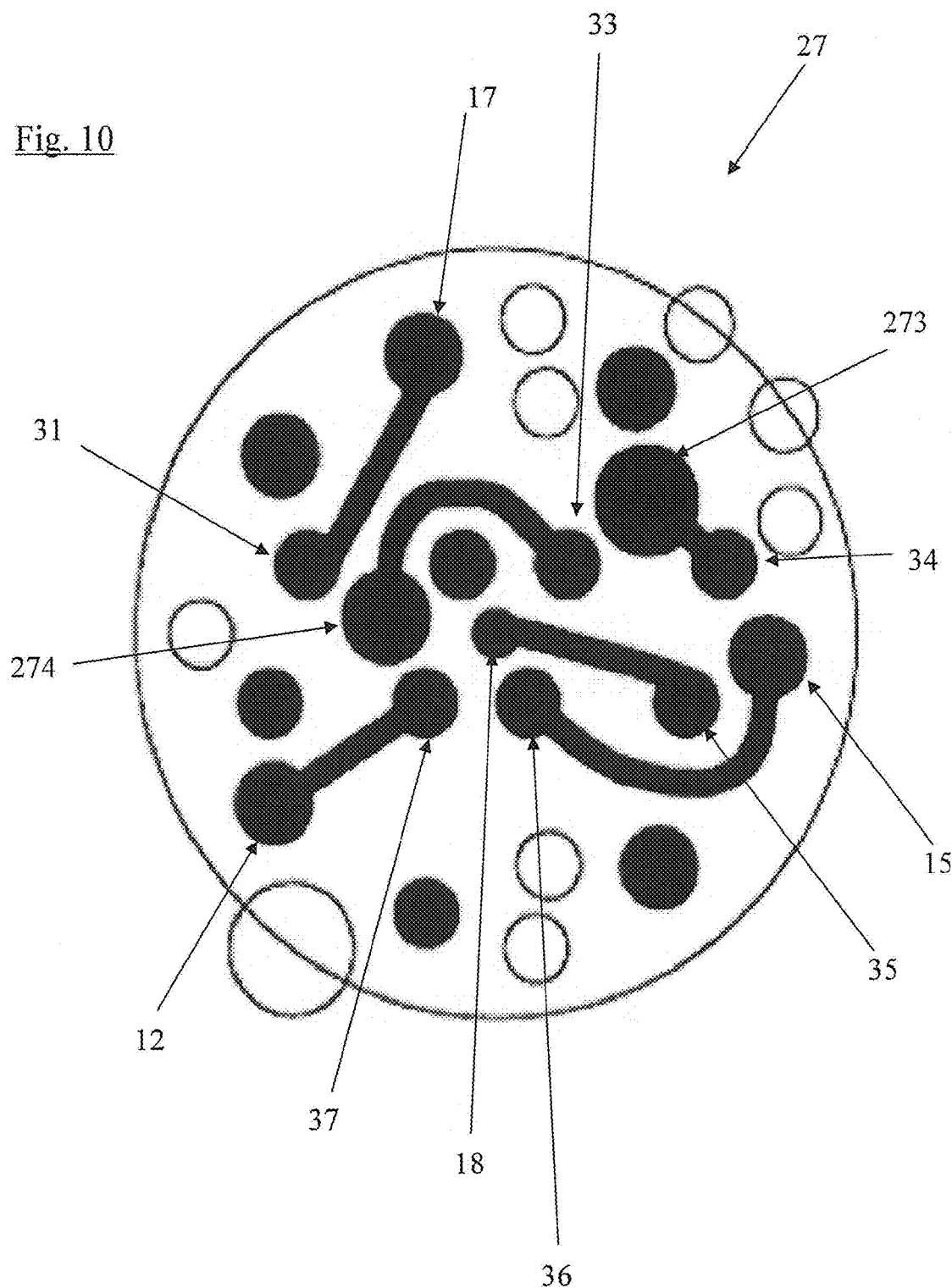
FIG. 10 is a schematic top view of the seventh layer of the printed circuit board according to FIG. 6.

However, by adapting the geometry, which is shown in FIG. 5a for outer pin contacts 11, 12, 13, 14, 15, 16 and 17 by the example of plug contact 11, and in FIG. 5b for inner pin contact 18, it is advantageously possible to provide adequate insulating distances and to prevent a short circuit between individual contacts and connection contacts during the assembly of the printed circuit board.

Referring to FIG. 5a, outer plug contact 11 has a curved transition region between its opposite ends 111 and 112. Consequently, and as shown in FIG. 3, the end 111 held in printed circuit board 20 and the corresponding ends of the other outer plug contacts 12, 13, 14, 15, 16, 17, are arranged at a greater common radius around the connection axis and, therefore, are sufficiently spaced from the connection contacts 31, 32, 33, 34, 35, 36, 37 and 38 held in printed circuit board 20, while, due to the curvature, i.e., the transition region, the opposite contact end and the corresponding contact ends of the other outer plug contacts 12, 13, 14, 15, 16, 17, are still arranged around the connection axis at the common radius that is required for a standardized plug face.

Referring to FIG. 5b, the central plug contact 18 of the round plug connector is still basically straight and has a contact end 181 in the form of a thin tip which forms a solder pin of plug contact 18 during attachment to printed circuit board 20.

The plug face of the freely assemblable round plug connector of an embodiment of the present invention is standard-compliant and, therefore, can also be implemented with the above-described connection blocks. As explained above, the inventive, freely assemblable round plug connector, which can also be used for Ethernet, includes a printed circuit board 20 accommodating conductive traces in at least two planes, of which some, in each case, electrically connect a plug contact and a connection contact within the printed circuit board to create a respective signal transmission path, while others create a capacitance between certain signal transmission paths.

For a wire assignment as assumed in FIGS. 3 and 4, it is expedient to use a printed circuit board 20 which is of a sandwich configuration including at least seven layers, as will be described below with reference to FIGS. 6 through 10. In this configuration, preferably, two conductive traces, in each case, form a parallel plate capacitor integrated in the printed circuit board so as to form a coupling capacitance. In an embodiment, such a parallel plate capacitor is formed by two small flat capacitor plates provided in two different planes, for example by surface coating with copper.

FIG. 6 diagrammatically shows printed circuit board 20, illustrating the multilayer structure selected for the exemplary embodiment. The structure includes a total of seven layers designated 21, 22, 23, 24, 25, 26 and 27.

First, third, fifth and seventh layer 21, 23, 25 and 27 each include conductive traces, which are formed by metallization or embossing techniques and used for electrically connecting signal transmission paths and/or for coupling selected signal transmission paths with balancing or coupling capacitances.

The layers located therebetween, which, according to FIG. 6, are second, fourth and sixth layers 22, 24 and 26, contain the base material of the printed circuit board and serve as a dielectric.

Layers 22 and 26 serve as a dielectric for the parallel plate capacitors integrated into layers 21 and 23, and 25 and 27, respectively, and are thinner than layer 24, which serves as a dielectric between two parallel plate capacitors integrated in different planes; i.e., between a parallel plate capacitor integrated into layers 21 and 23 and a parallel plate capacitor integrated into layers 25 and 27.

Moreover, the spacing between the individual conductive trace layers 21, 23, 25, 27 may be determined by the construction of the printed circuit board, and the capacitance value may be varied via the size of the capacitor surfaces based on fixed parameters and a constant dielectric constant of the base material of the printed circuit board.

A material that can be used as a base material for the printed circuit board is for example, FR-4 material.

FIGS. 7, 8, 9 and 10 show, successively, the patterns of the conductive traces on the first conductive trace-containing layer 21 which, according to FIG. 6, is the first or top layer, on the second conductive trace-containing layer 23 which, according to FIG. 6, is the first inner, conductive trace-containing layer, or third layer 23, on the third conductive trace-containing layer 25 which, according to FIG. 6, is the second inner, conductive trace-containing layer, or fifth layer 25, and on the fourth conductive trace-containing layer 27 which, according to FIG. 6, is the seventh or bottom layer 27.

As can be seen, layer 23 electrically connects
plug contact 11 to connection contact 32,
plug contact 16 to connection contact 33,
plug contact 14 to connection contact 34, plug contact 13 to connection contact 38, as well as
connection contact 33 to a capacitor plate 211,
and connection contact 37 to a capacitor plate 212,
while layer 22 electrically connects
plug contact 14 to a capacitor plate 232, and
connection contact 38 to a capacitor plate 231.

In this configuration, capacitor plate 211 and capacitor plate 231 form a first parallel plate capacitor to provide a first balancing capacitance, while capacitor plate 212 and capacitor plate 232 form a second parallel plate capacitor to provide a second balancing capacitance.

Layer 25 electrically connects
plug contact 17 to a capacitor plate 253, and
connection contact 32 to a capacitor plate 254;
while layer 27 electrically connects
plug contact 12 to connection contact 37,
plug contact 17 to connection contact 31,
plug contact 15 to connection contact 36,
plug contact 18 to connection contact 35, as well as
connection contact 34 to a capacitor plate 273, and
connection contact 33 to a capacitor plate 274.

In this configuration, capacitor plate 253 and capacitor plate 273 form a third parallel plate capacitor to provide a third balancing capacitance, while capacitor plate 254 and capacitor plate 274 form a fourth parallel plate capacitor to provide a fourth balancing capacitance.

When also considering the descriptions of FIGS. 3 and 4, first signal pair 1 which, in accordance with connection block 30, is routed via connection contacts 35-36, is thus applied to plug contacts 18-15 (signal transmission path pair 8-5). Second signal pair 2 which, in accordance with connection block 30, is routed via connection contacts 38-37, is thus applied to plug contacts 13-12 (signal transmission path pair 3-2). Third signal pair 3 which, in accordance with connection block 30, is routed via connection contacts 33-34, is thus applied to plug contacts 16-14 (signal transmission path pair 6-4). Fourth signal pair 4 which, in accordance with connection block 30, is routed via connection contacts 31-32, is thus applied to plug contacts 17-11 (signal transmission path pair 7-1).

Moreover, a capacitance is provided between signal transmission paths 3 and 6, signal transmission paths 2 and 4, signal transmission paths 7 and 4, and between signal transmission paths 1 and 6, respectively.

Figure 11:
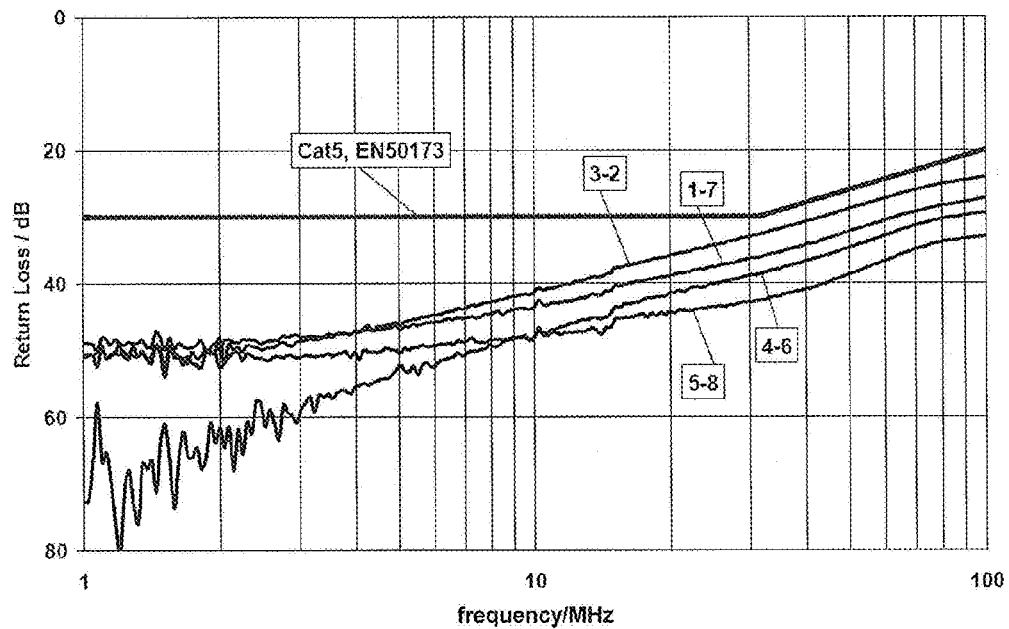
FIG. 11 is a graph illustrating the return loss based on a printed circuit board structure according to FIGS. 7 through 10.
Figure 12:
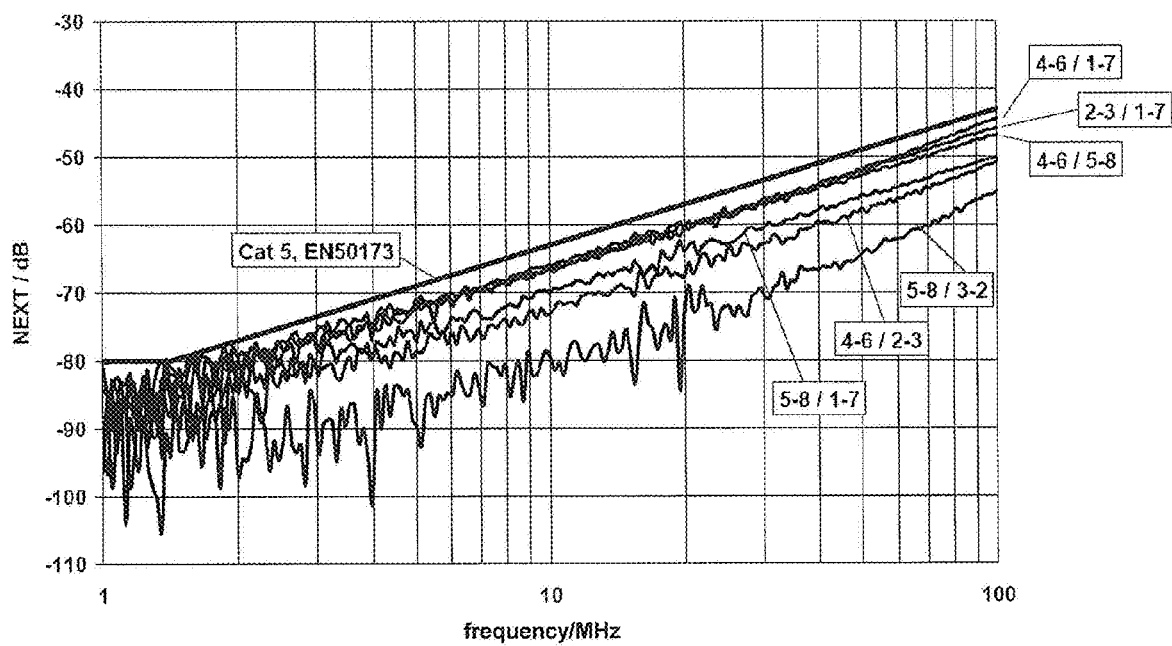
FIG. 12 is a graph illustrating the crosstalk loss based on a printed circuit board structure according to FIGS. 7 through 10.

Based on the specific exemplary embodiment described above, FIGS. 11, 12 show examples of measured curves of the RETURN LOSS of the individual signal pairs and the NEXT of the various signal pair combinations of the industrial round plug connector of an embodiment of the present invention, which is freely assemblable and can also be used for Ethernet. It can be seen that both parameters meet the Cat5 requirements for plug connectors.

The present application is not limited to the embodiments described herein; reference should be had to the appended claims.

What is claimed is:

1. A connector comprising:
    an inner structure divided into first, second, and third components,
    the first component including plug contacts disposed so as to form a circular plug face configured for connection to a mating connector;
    the second component including a connection block having connection contacts configured for connection of a data line connection and a respective receiving element electrically connected to each connection contact and configured to receive a wire of a data cable; and
    the third component including a printed circuit board disposed on an end face of the connection block to provide a connecting element between the connection block and the plug contacts, the printed circuit board configured to provide a signal transmission path between the plug contacts and the connection contacts of the connection block, the connection contacts extending outwardly from a surface of the printed circuit board and being secured in the printed circuit board, the printed circuit board including a plurality of layers in a sandwich configuration, the plurality of layers including layers having conductive trace alternating with layers having a dielectric, a first layer of the layers having a dielectric being disposed between a first and second layer of the layers having conductive trace so as to form a first parallel plate capacitor, a second layer of the layers having a dielectric being disposed between a third and fourth layer of the layers having trace so as to form a second parallel plate capacitor, a third layer of the layers having a dielectric being disposed between the first and second parallel plate capacitors, wherein at least one of the first and second layers having a dielectric is thinner than the third layer having a dielectric.

2. The connector as recited in claim 1, wherein the connector is an 8-pole MI 2 connector.

3. The connector as recited in claim 1, wherein the connection contacts are disposed in a rectangular pattern.

4. A connector comprising:
    a connecting element having a circular cross-section and configured to provide a mechanical connection to a complementary mating connector along a connection axis extending in a direction perpendicular to the cross-section;
    a printed circuit board extending parallel to the cross-section and having a first surface and an opposite second surface, the printed circuit board configured to provide at least one of: (a) a signal transmission path between a plug contact and a connection contact and (b) a capacitance between signal transmission paths, the printed circuit board including a plurality of layers in a sandwich configuration, the plurality of layers including layers having conductive trace alternating with dielectric layers, a first layer of the layers having a dielectric being disposed between a first and second layer of the layers having conductive trace so as to form a first parallel plate capacitor, a second layer of the layers having a dielectric being disposed between a third and fourth layer of the layers having trace so as to form a second parallel plate capacitor, a third layer of the layers having a dielectric being disposed between the first and second parallel plate capacitors, wherein at least one of the first and second layers having a dielectric is thinner than the third layer having a dielectric;
    a plurality of elongated plug contacts extending parallel to the connection axis, each plug contact having a first end and a second end, the first end of the plug contacts extending from the first surface of the printed circuit board into the printed circuit board and being secured to the printed circuit board therein, the second end of the plug contacts defining a circular connection face; and
    a connection block disposed on the second surface of the printed circuit board, the connection block having a plurality of connection contacts corresponding to a number of the plurality of plug contacts and a respective receiving element for each connection contact, the connection contacts extending from the second surface of the printed circuit board into the printed circuit board and being secured therein, and each respective receiving element being electrically connected to the respective connection contact and configured to receive a wire of a data cable.

5. The connector as recited in claim 4, wherein the second end of the plug contacts is a pin contact.

6. The connector as recited in claim 4, wherein the second end of the plug contacts is a socket.

7. The connector as recited in claim 4, wherein the capacitance between the signal transmission paths is provided via the conductive trace of the first and second layers having conductive trace.

8. The connector as recited in claim 7, wherein the first parallel plate capacitor is a flat parallel plate capacitor.

9. The connector as recited in claim 8, wherein the signal transmission paths are based on a RJ-45 standard.

10. The connector as recited in claim 4, wherein the connection contacts are secured to the printed circuit board radially parallel to the connection axis.

11. The connector as recited in claim 4, wherein a diameter of the circular plug face is defined by the plug contacts, the plug contacts being disposed at a radius around the connection axis.

12. The connector as recited in claim 11, further comprising an additional inner plug contact disposed within the radius.

13. The connector as recited in claim 4, wherein the first ends of the plug contacts are disposed at a first common radius radially around the connection axis.

14. The connector as recited in claim 4, wherein each plug contact includes a transition region between the respective first end and the respective second end, and the second ends are disposed at a common radius around the connection axis.

* * * * *